United States Patent [19]

Varshney et al.

[11] Patent Number: 4,480,199

[45] Date of Patent: Oct. 30, 1984

[54] IDENTIFICATION OF REPAIRED INTEGRATED CIRCUITS

[75] Inventors: Ramesh C. Varshney; Robert J. Strain, both of San Jose, Calif.

[73] Assignee: Fairchild Camera & Instrument Corporation, Mountain View, Calif.

[21] Appl. No.: 360,028

[22] Filed: Mar. 19, 1982

[51] Int. Cl.³ .................... H03K 19/40; H02H 7/20
[52] U.S. Cl. ............................ 307/303; 307/202.1; 365/96; 365/200
[58] Field of Search ............ 307/303, 202.1; 357/51; 365/96, 200, 201

[56] References Cited

U.S. PATENT DOCUMENTS

| | | | |
|---|---|---|---|
| 3,335,403 | 8/1967 | Mann et al. | 307/441 |
| 3,930,304 | 1/1976 | Keller et al. | 357/51 |
| 4,064,493 | 12/1977 | Davis et al. | 365/95 |
| 4,104,546 | 8/1978 | Seiler | 307/303 |
| 4,406,997 | 9/1983 | Depp et al. | 365/200 |

Primary Examiner—John S. Heyman
Assistant Examiner—Timothy P. Callahan
Attorney, Agent, or Firm—Kenneth Olsen; Robert C. Colwell; Carl Silverman

[57] ABSTRACT

A circuit for providing an identification signal indicative of whether or not an integrated circuit has been repaired includes a circuit which operates at potentials outside the normal range of the integrated circuit. The circuit includes at least one transistor T1 serially connected between a TTL pin 10 of the integrated circuit and a fuse F1. The fuse F1 is also connected to a potential source $V_{CC}$. If the integrated circuit is repaired the fuse F1 is opened, and consequently, application of a potential outside the normal range will cause current to flow if fuse F1 has not been opened, and cause no current to flow if fuse F1 has been opened.

15 Claims, 6 Drawing Figures

IDENTIFICATION OF REPAIRED INTEGRATED CIRCUITS

BACKGROUND OF THE INVENTION

1. Field of the Invention

This invention relates to integrated circuits, and in particular, to the identification of integrated circuits which have been processed in a particular manner, for example, to identify those integrated circuits which have been repaired by having redundant portions connected.

2. Description of the Prior Art

The size of very large scale integrated circuit products is increasing continuously. At the same time improvements in process technology are enabling the fabrication of smaller components on integrated circuits, and therefore even more devices on a given size integrated circuit. To improve yields some integrated circuits are now designed with redundant features which may be utilized should other features be found non-functional. These redundant circuits replace defective sections of the integrated circuit so that a fully functional product may be sold after the integrated circuit is appropriately connected.

One major problem in the fabrication and sale of such devices is that the repair may be transparent to the user after the integrated circuit is packaged. Some high reliability integrated circuit users prefer not to use redundant features on the integrated circuit because of their belief that the reliability of such redundant features is questionable. Because the customer may not desire the redundant features, the manufacturer of such circuits may hesitate to include the features on a given circuit.

SUMMARY OF THE INVENTION

This invention provides a technique by which "repaired" integrated circuits may be identified while leaving the repair transparent to the customer. The invention enables the detection of the repaired circuits even after packaging, and whereby enables a manufacturer of integrated circuits to include redundant features on an integrated circuit, although selling that circuit in both unrepaired and repaired form. In the preferred embodiment identification of the repaired integrated circuit is accomplished by providing one or more pins of the integrated circuit with unusual characteristics outside their normal operating range. Accordingly, during normal operation of the circuit all of the integrated circuit will behave as if not repaired. When one or more pins of the circuit, however, are taken beyond the normal operating range, that pin or pins will behave differently on repaired integrated circuits than on unrepaired circuits. More broadly the invention provides a general technique by which particular integrated circuits may be identified although functioning identically from the user's viewpoint.

In one embodiment apparatus for providing an identification signal indicative of whether an integrated circuit has been repaired comprises a first connection to the integrated circuit having a selected range of operating potentials, a second connection to the integrated circuit for being connected to a potential source; fusing means coupled to one of the first connection and the second connection for providing a conducting path if the fusing means is in a first state, and no conducting path if the fuse is in a second state, and circuit means coupled to the fusing means and to the other of the first connection and the second connection, whereby application of a test potential outside the selected operating range to the first connection results in a first signal if the fusing means is intact and a second signal if the fusing means is not intact.

DETAILED DESCRIPTION OF THE PREFERRED EMBODIMENTS

Figure 1:
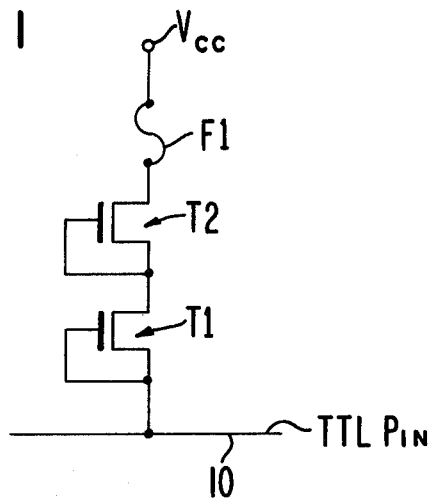
FIG. 1 is a schematic of one embodiment of the invention in which potentials above the operating range of the circuit are used to test the state of the fuse.

FIG. 1 a schematic diagram of one embodiment of the invention. As shown in FIG. 1 the circuit includes a first connection 10 designated TTL pin 10 which is typically connected to other circuit elements in the integrated circuit. For example, connection 10 may be a line over which a TTL or other low level signal is transmitted to or from the integrated circuit. Coupled to line 10 are two transistors T1 and T2 connected as diodes. Transistor T1 has its source and drain connected between transistor T2 and line 10. The gate of transistor T1 is coupled to line 10. Transistor T2 has its source and drain coupled between transistor T1 and fuse F1, while its gate is connected between transistors T1 and T2. A fusing means F1 is coupled between transistor T2 and a potential source $V_{CC}$. In the preferred embodiment fusing means F1 comprises a metal/doped polycrystalline silicon fuse which may be "blown" using a laser or any other well-known fuse suitable for use in an integrated circuit. Typical fuses are shown in FIG. 4. Transistors T1 and T2 are enhancement mode transistors, and therefore during normal operation of the circuit there is no conduction between TTL pin 10 and $V_{CC}$. If, however, a potential is applied to pin 10 which is higher than $V_{CC}$ by two threshold voltages, current will flow through the devices T1 and T2 if fuse F1 has not been blown. This current flow may be used to indicate a first state of the integrated circuit, typically that the circuit has not been repaired.

After the circuit has been repaired, application of a potential to pin 10 two or more threshold voltages above $V_{CC}$ will not cause any current to flow through transistor T1 and T2 because the fuse F1 will have been blown. As apparent from FIG. 1, as few or many tranistors T1 and T2 may be employed as desired depending upon the particular threshold voltage of the transistors, and the normal operation potentials applied to pin 10 to assure that the test potential for detecting the state of fuse F1 is outside the normal operating range of the circuit coupled to pin 10.

The particular operating characteristics of the circuit shown in FIG. 1 will depend upon the type of fuse F1 used to indicate the desired feature of the integrated circuit. For example, fuse F1 may be fabricated as a "normally open" fuse in the manner depicted in FIG. 4c. In such an embodiment, the normal state of the circuit shown in FIG. 1 will be nonconducting when a voltage greater than two threshold voltages over $V_{CC}$ is applied to the TTL pin 10. Repair of the circuit in the case of the fuse shown in FIG. 4c, will form an electrical connection and allow conduction from TTL pin 10 to $V_{CC}$.

Furthermore, fuse F1 may also be fabricated using a fuse which is "blown" by application of a short pulse of electrical current in excess of the amount the fuse can carry. This type of fuse is described in conjunction with FIG. 4b. In such embodiments the potential used to later detect the condition of fuse F1 will be maintained below the amount necessary to blow such a fuse. Of course fuse F1 may also be placed between TTL pin 10 and transistor T1, or between transistor T1 and transistor T2. In either event the circuit will function in the same manner.

Figure 2:
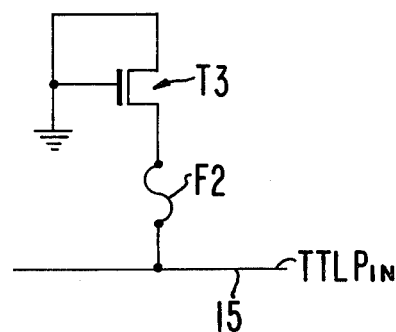
FIG. 2 is a schematic of another embodiment of the invention in which potentials below the operating range of the circuit are used to test the state of the fuse.

Another embodiment of the invention is depicted in FIG. 2, in which a fuse F2 is connected between a transistor T3 and TTL pin 15. Such an embodiment may be employed in applications where it is desired to sense the condition of fuse F2 by lowering the potential of TTL pin 15 below ground. For example, the circuit shown in FIG. 2 will conduct when the TTL pin 15 is taken to a potential of one threshold voltage below ground. As previously described the state of fuse F2 can be used to indicate the repaired, unrepaired, or any other desired feature of the integrated circuit coupled to TTL pin 15. Additional transistors such as T3 may be serially connected to adjust the potential at which the circuit will conduct.

Figure 3:
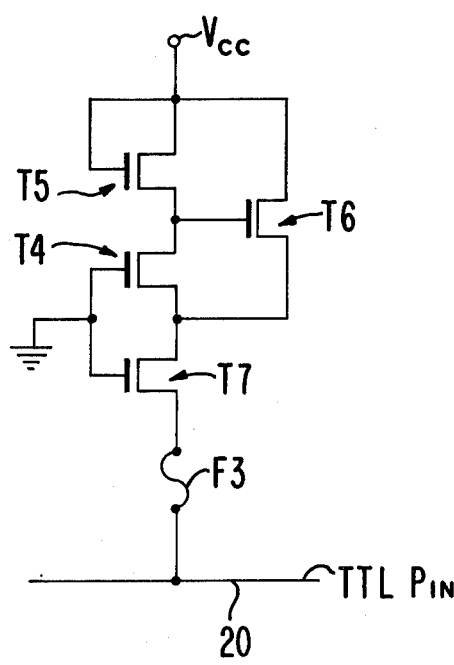
FIG. 3 is a schematic of another embodiment of the invention.

Another embodiment of the invention is shown in FIG. 3 in which the threshold voltage of T7 is raised. As shown in FIG. 3 a fuse F3 is connected between TTL pin 20 and a circuit which includes transistors T4, T5, T6, and T7. That circuit is also connected to a potential $V_{CC}$. The circuit is tested by bringing TTL pin 20 lower than its normal operating range. In the manner depicted a current will flow from $V_{CC}$ to TTL pin 20 unless fuse F3 is blown. If fuse F3 is blown no current can flow to the pin. The presence or absence of current flowing to pin 20 when TTL pin 20 is brought to a lower potential than ground is indicative of the repaired or unrepaired state, respectively, of the integrated circuit.

Figure 4A:
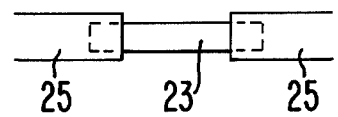
FIGS. 4a-4c illustrate typical fuses which may be used in conjunction with this invention.
Figure 4B:
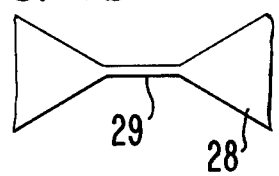
Figure 4C:
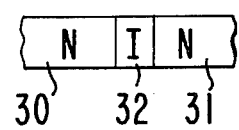

Several different types of fuses which may be employed in conjunction with this invention are depicted in FIGS. 4a, 4b, and 4c. FIG. 4a illustrates a well-known fuse fabricated from metal 25 and polycrystalline silicon 23. In its unblown state, fuse 4a conducts electrical current through the metal 25 and doped polycrystalline silicon 23. The fuse may be blown by using a laser to destroy a portion of polycrystalline silicon 23, thereby preventing current flow from one metal strip 25 to the other. Such a fuse is shown in "Cost-Effective Yield Improvement in Fault-Tolerant VLSI Memory", by J. F. M. Bindels, 1981 *Digest of Technical Papers of International Solid State Circuits Conference.*

A second fuse is illustrated in FIG. 4b in which doped polycrystalline silicon is tapered from a wider region 28 to a narrower region 29. By application of a suitably high potential the fuse shown in FIG. 4b may be blown, by melting, or otherwise destroying the narrower region 29. The dimensions of regions 28 and 29 may be adjusted to permit blowing the fuse shown in FIG. 4b at a potential higher than the operating range of the integrated circuit in which it is situated. The potential may be applied as a pulse to prevent damage to the remainder of the circuit.

A third, and normally open, type fuse is shown in FIG. 4c. The fuse depicted there is fabricated using two doped regions 30 and 31 separated by an intrinsic silicon region 32. Under normal circumstances the fuse is open because very little, or no current, will flow from region 30 to 31. By heating the structure, for example, using a laser, the impurities present in regions 30 and 31 will diffuse into region 32 and form a conducting path from region 30 to region 31. Such a fuse is shown in "Hi-CMOS II 4k Static RAM" by O. Minato et al, 1981 *Digest of Technical Papers of International Solid State Circuits Conference,* p. 14–15. As explained above, this normally open fuse may be utilized in conjunction with the invention.

The invention is advantageous in that one can readily identify a repaired integrated circuit from defect free integrated circuits which have not been "repaired." The fuses which are blown, shown in FIGS. 1 and 2, need not be blown if no repair is needed on the chip. Thus, a fully functional integrated circuit need not have any additional electrical signals, or laser processing applied to it to blow fuses. Because the identification is done outside the normal operating range of the integrated circuit, the operating characteristics of the circuit are not changed by the presence of the invention. Blowing the identification fuses may be accomplished at the same time other fuses elsewhere on the chip are blown to make the necessary repairs. The invention permits identification of integrated circuits having differences which are normally transparent to the use and allows characterization of repaired or unrepaired circuits.

Although embodiments of the invention have been described above, these embodiments are intended to illustrative of the invention rather than limit it. The scope of the invention may be ascertained from the appended claims.

I claim:

1. Apparatus for providing an identification signal indicative of the presence or absence of a feature in an integrated circuit having an integrated circuit lead which has a selected range of operating potentials applied to it and having a a first power lead for being connected to a potential source, said apparatus comprising:

fusing means having a first lead and a second lead, said fusing means having a first state corresponding to the presence of said feature in said integrated circuit and a second state corresponding to the absence of said integrated circuit, said first lead being connected to said first power lead or to said integrated circuit lead but not to both;

circuit means having a first lead and a second lead, said first lead of said circuit means being connected to said second lead of said fusing means, said second lead of said circuit means being connected to that one of said first power lead or said circuit lead which is not connected to said first lead of said fusing means;

said fusing means and said circuit means operating as an open circuit when said potential source is connected to said first power lead and a potential from said selected range of operating potentials is applied to said integrated circuit lead;

said fusing means and said circuit means, when said potential source is connected to said first power lead and a potential not in said selected range of operating potentials is applied to said circuit lead, producing a first signal if said fusing means is in said first state and a second signal if said fusing means is in the said second state.

2. Apparatus as in claim 1 wherein said first lead of said fusing means is connected to said first power lead and said second lead of said circuit means is connected to said circuit lead.

3. Apparatus as in claim 1 wherein said first lead of said fusing means is connected to said circuit lead and said second lead of said circuit means is connected to said first power lead.

4. Apparatus as in claim 2 wherein said circuit means comprises a diode whose cathode is connected to said second lead of said fusing means and whose anode is connected to said circuit lead.

5. Apparatus as in claim 3 wherein said circuit means comprises a diode whose cathode is connected to said second lead of said fusing means and whose anode is connected to said power lead.

6. Apparatus as in claim 4 wherein said diode comprises a diode connected MOS transistor having a gate, a source, and a drain, said source comprising said cathode, said gate and said drain being connected to form said anode.

7. Apparatus as in claim 5 wherein said diode comprises a diode connected MOS transistor having a gate, a source, and a drain, said source comprising said cathode, said gate and said drain being connected to form said anode.

8. Apparatus as in claim 1 wherein said potential source is ground.

9. Apparatus as in claim 2 wherein said circuit means comprises a plurality of diodes $D_1 \ldots D_N$ where N is a positive integer greater than or equal to 2 and wherein the the cathode of $D_N$ is connected to said second lead of said fusing means, the cathode if $D_i$ is connected to the anode of $D_{(i+1)}$ for $i=1, \ldots N-1$, and the anode of $D_1$ is connected to said circuit lead.

10. Apparatus as in claim 3 wherein said circuit means comprises a plurality of diodes $D_1, \ldots D_N$, where N is a positive integer greater than or equal to 2 wherein the cathode of $D_N$ is connected to said second lead of said fusing means, the cathode of $D_i$ is connected to the anode of $D_{(i+1)}$, for $i=1, \ldots N-1$ and the anode of $D_1$ is connected to said first power lead.

11. Apparatus as in claim 9 wherein each of said diodes comprises a diode connected MOS transistor having a gate, a source, and a drain, said gate and said drain of each said transistor being connected to form said anode of said diode.

12. Apparatus as in claim 10 wherein each of said diodes comprises a diode connected MOS transistor having a gate, a source, and a drain, said gate and said drain of each said transistor being connected to form said anode of said diode.

13. Apparatus as in claim 2 wherein said integrated circuit has a second power lead connected to ground and said circuit means comprises a first, a second and a third transistor, each having a gate, a source, and a drain, the gate and the drain of said first transistor being connected to said first power lead, the source of said first transistor being connected to the drain of said second transistor, the source of said second transistor being connected to the drain of said third transistor whose source is connected to said second lead of said fusing means, the gates of said second and said third transistors being connected to said second power lead.

14. Apparatus as in claim 13 wherein said circuit means further comprises a fourth transistor having a gate, a drain, and a source, the drain of said fourth transistor being connected to the drain of said first transistor, the source of said fourth transistor being connected to said source of said second transistor, and the gate of said fourth transistor being connected to the source of said first transistor.

15. A method of identifying the presence or absence of a feature in an integrated circuit having a circuit lead which has a selected range of operating potentials applied to it, said method comprising:

placing fusing means in said circuit in a first state corresponding to the presence of said feature or in a second state corresponding to the absence of said feature;

including within the integrated circuit a circuit which together with said fusing means is responsive only to signals outside said selected range of operating potentials, producing a first signal if said fusing means is in said first state and producing a second signal if the fusing means is in said second state.

* * * * *

UNITED STATES PATENT AND TRADEMARK OFFICE
CERTIFICATE OF CORRECTION

PATENT NO. : 4,480,199
DATED : October 30, 1984
INVENTOR(S) : Ramesh C. Varshney, Robert J. Strain It is certified that error appears in the above-identified patent and that said Letters Patent is hereby corrected as shown below:

Column 4, Line 49, after "said" (1st occurrence) insert
--feature in said--

Signed and Sealed this

Fourteenth Day of September, 1993

Attest:

BRUCE LEHMAN

*Attesting Officer*  *Commissioner of Patents and Trademarks*